US012658910B2

(12) United States Patent
Grasso et al.

(10) Patent No.: US 12,658,910 B2
(45) Date of Patent: Jun. 16, 2026

(54) TRANSISTOR DEVICE AND METHOD OF OPERATING A TRANSISTOR DEVICE

(71) Applicant: Infineon Technologies AG, Neubiberg (DE)

(72) Inventors: Massimo Grasso, Trivolzio (IT); Daniele Miatton, Carbonara Al Ticino (IT)

(73) Assignee: Infineon Technologies AG, Neubiberg (DE)

( * ) Notice: Subject to any disclaimer, the term of this patent is extended or adjusted under 35 U.S.C. 154(b) by 408 days.

(21) Appl. No.: 18/167,361

(22) Filed: Feb. 10, 2023

(65) Prior Publication Data
US 2023/0275577 A1     Aug. 31, 2023

(30) Foreign Application Priority Data

Feb. 25, 2022     (EP) ..................................... 22158797

(51) Int. Cl.
*H03K 17/082*          (2006.01)

(52) U.S. Cl.
CPC ................................. *H03K 17/082* (2013.01)

(58) Field of Classification Search
CPC .............................................. H03K 17/082
USPC ......................................................... 361/58
See application file for complete search history.

(56) References Cited

U.S. PATENT DOCUMENTS

| | | | |
|---|---|---|---|
| 5,212,616 A * | 5/1993 | Dhong ................. | H10D 84/854 361/88 |
| 5,903,034 A | 5/1999 | Sakamoto et al. | |
| 7,773,359 B2 * | 8/2010 | Hinterscher ........... | H02H 9/025 361/18 |
| 9,748,942 B2 * | 8/2017 | Akahane ............ | H03K 17/0828 |
| 11,552,073 B2 * | 1/2023 | Tanaka ................... | H02H 9/025 |
| 2003/0062947 A1 * | 4/2003 | Grasso ............... | H03K 17/0822 327/538 |
| 2008/0007243 A1 * | 1/2008 | Matsumoto ............... | G05F 3/30 323/313 |

FOREIGN PATENT DOCUMENTS

| | | | | |
|---|---|---|---|---|
| CN | 206991152 U | * | 2/2018 | |
| EP | 1087527 A2 | | 3/2001 | |
| EP | 3958467 A1 | | 2/2022 | |
| WO | WO1998033274 A1 | * | 7/1998 | ........... H03K 17/082 |

* cited by examiner

*Primary Examiner* — Crystal L Hammond
*Assistant Examiner* — Samantha L Faubert
(74) *Attorney, Agent, or Firm* — Harrity & Harrity, LLP

(57)          ABSTRACT
A transistor device is provided including a first device load terminal, a second device load terminal and a device control terminal. The device includes a transistor. A first transistor load terminal is coupled to the first device load terminal, a second transistor load terminal is coupled to a second device load terminal, and a transistor control terminal is coupled to the device control terminal via a variable impedance element. An overload detection circuit switches the variable impedance element from a first state with lower impedance to a second state with higher impedance in response to detecting an overload condition.

20 Claims, 5 Drawing Sheets

TRANSISTOR DEVICE AND METHOD OF OPERATING A TRANSISTOR DEVICE

CROSS REFERENCE TO RELATED APPLICATION

This application claims priority to European Patent Application No. 22158797 filed on Feb. 25, 2022, the content of which is incorporated by reference herein in its entirety.

TECHNICAL FIELD

The present application relates to transistor devices and to methods for operating transistor devices.

BACKGROUND

In many applications, transistor devices are used as switches. An example are power supply or power conversion applications, where a transistor device may be used to selectively couple a power source to a load. For example, transistor devices are used as switches in switched mode power supplies (SMPS), or directly as power switches.

Depending on the application, a system including the transistor device may be required to withstand some critical system exceptions, referred to as overload conditions herein. One example for such an overload condition is a short circuit, corresponding to a very low ohmic load.

In many cases, such overload conditions are managed by detecting the overload condition and then turning off the system, for example switching off the transistor device to separate the load from the power source. In this approach, there is a certain delay between the occurrence of the system exception, for example the short circuit, and the actual turning off. Such delays are e.g., caused by filters used in detectors to remove noise and by the actuation of the turning off sequence. During this delay time the overload condition remains unchanged, such that the transistor device has to withstand the overload condition, for example short circuit condition, for a at least for the time it takes to turn off the system. The longer the transistor device can withstand the overload condition, the easier the implementation of the above detection and turn-off scheme is, as the requirements regarding timing become more relaxed.

SUMMARY

A transistor device as defined in claim 1 and a method as defined in claim 15 are provided. The dependent claims define further implementations.

According to an implementation, a transistor device is provided, including: a first device load terminal; a second device load terminal, a device control terminal; a transistor having a first transistor load terminal coupled to the first device load terminal, a second transistor load terminal coupled to the second device load terminal, and a transistor control terminal coupled to the device control terminal; a variable impedance element coupled between the device control terminal and the transistor control terminal; and an overload detection circuit configured to switch the variable impedance element from a first state with lower impedance to a second state with higher impedance in response to detecting the overload condition.

According to another implementation, a method for operating a transistor device is provided, including: detecting an overload condition; and switching a variable impedance element between a driver and a control terminal of a transistor from a first state with lower impedance to a second state with higher impedance in response to detecting the overload condition.

The above summary is merely intended to give a brief overview over some implementations and is not to be construed as limiting in any way, as other implementations may include different features than the ones listed above.

DETAILED DESCRIPTION

Figure 1:
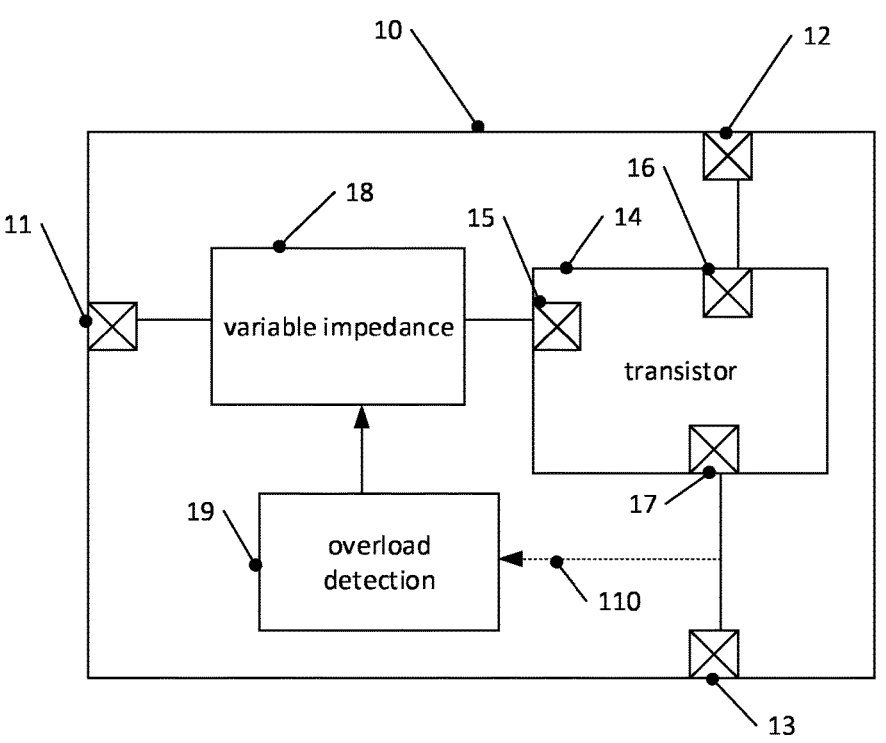
FIG. 1 is a block diagram of a transistor device according to an implementation.

In the following, various implementations will be described in detail referring to the attached drawings. These implementations are to be understood as examples only and are not to be construed as limiting. For example, while implementations may be described as comprising specific features (for example elements, components, devices, acts or events), in other implementations some of these features may be omitted or may be replaced by alternative features. In addition to the features explicitly shown and described, additional features may be provided, for example features conventionally used in transistor circuits, driver circuits or systems and methods associated therewith.

Connections or couplings mentioned herein refer to electrical connections or couplings unless noted otherwise. Such connections or couplings may be modified, for example by adding or removing intervening elements, as long as the general function of the connection or coupling is preserved.

Some implementations relate to a transistor device. The transistor device may serve as a switch. A transistor device may include one or more transistors, which may act as switches. In the following, for ease of explanation, mostly reference is made to a single transistor, with the understanding that more than one transistor may also be used. In some implementations, the transistor may be a power transistor configured for switching high currents or voltages, for example currents of several amperes or voltages of several 10 Volts or even 100 Volts or above. However, in other implementations the transistor may also be configured for lower voltages or currents, depending on the application. When a transistor is used as a switch, this means that it is, at least in normal operation, either in an on state or an off state, for example in contrast to transistors used in a linear range, for example in amplifier applications. However, techniques discussed herein may also be used for such transistors not used as switches.

The term transistor, as used herein, also includes transistors made up of a plurality of transistor cells coupled in series or in parallel, for example to increase a maximum voltage or current the transistor is configured for.

Transistors are described as comprising a control terminal, a first load terminal and a second load terminal. By applying a control signal to the control terminal, a resistance of the transistor between the first and second load terminals may be varied. In particular, the transistor may be switched on or off. A transistor switch is switched on or in an on state when it provides a low ohmic connection between its first and second load terminals, the resistance of this connection being commonly referred to as on resistance Ron, and is switched off when it essentially provides an electric isolation (apart from very small leakage currents, which may occur in real implementations) between its first and second load terminals.

Various types of transistors may be used. Examples include field effect transistors (FETs) like metal oxide semiconductor field effect transistors (MOSFETs), bipolar junction transistors (BJTs), or insulated gate bipolar transistors (IGBTs). Transistors may be based on various semiconductor materials like silicon (Si), silicon carbide (SiC), or III-IV compounds like gallium arsenide or gallium nitride. For example, for some power applications a SiC MOSFET may be used in some implementations.

In case of a field effect transistor, the control terminal is the gate terminal, and the load terminals are the source and drain terminals. In case of a bipolar junction transistor, the control terminal is the base terminal, and the load terminals are the emitter and collector terminals. In case of an insulated gate bipolar transistor, the control terminal is the gate terminal, and the load terminals are the emitter and collector terminals. In some cases, additional terminals like an auxiliary source terminal may be present. Therefore, describing a transistor with three terminals (control terminal and first and second load terminals) does not exclude the possibility that further terminals are provided.

While in the following transistor devices with a single transistor (also referred to as main transistor) to be coupled to a load or other devices external to the transistor device are discussed, the reference to "a transistor" is intended to cover also cases where two or more transistors are used. For example, two transistors may be arranged in a half bridge configuration, or four or six transistors may be arranged in pairs of half bridge configurations, for example for driving different phases of an electric motor. Different transistors in such cases may be of the same type or different types. Nevertheless, for ease of discussion, transistor devices discussed in the following will include a single main transistor carrying out the transistor function of the transistor device.

A control signal for controlling the transistor of the transistor device, for example switching it on or off, may be supplied by a driver circuit, referred to as gate driver in case of field effect transistors or IGBTs. Such a driver circuit may be provided separately to the transistor device, for example on a separate chip, in a separate housing, integrated with another electronic circuit etc.

FIG. 1 illustrates a transistor device 10 according to an implementation. Transistor device 10 includes a transistor 14 having a transistor control terminal 15, a first transistor load terminal 16 and a second transistor load terminal 17. Device 10 has a device control terminal 11, a first device load terminal 12 and a second device load terminal 13. First device load terminal 12 is coupled to first transistor load terminal 16, and second device load terminal 13 is coupled to second device load terminal 17. Device control terminal 11 is coupled to transistor control terminal 15 via a variable impedance element 18. During normal operation, for example outside any overload conditions or other system exceptions, variable impedance element 18 has a low impedance, for example below 50 Ohm, or below 10 Ohm. In this case, transistor device 10 essentially behaves, from the outside, like transistor 14 alone, as device terminals 11, 12 and 13 are coupled to the corresponding transistor terminals 15, 16 and 17. This enables transistor device 10 to be used in all applications where transistor 14 alone can be used, for example as a switch, where transistor 14 is used as a switch transistor. In this respect, device 10 may be provided in a single package or module, with the device terminals 11, 12 and 13 (which does not rule out the possibility of additional terminals being present for other purposes than described herein), such that a single package is provided that may be used as a transistor, for example as a transistor switch.

Transistor device 10 further comprises an overload detection circuit 19. Overload detection circuit 19 is configured, as indicated by a dashed arrow 110, to detect an overload condition of transistor 14, for example a current through transistor 13 above a predefined threshold, or a voltage across transistor 14 above a predefined threshold, or an electrical power through transistor 14 above a predefined threshold. For example, a current above a predefined threshold may be indicative of a short circuit condition, as a short circuit generally causes a high current to flow.

In response to detecting the overload condition, overload detection circuit 19 controls variable impedance element 18 to have a second state with a higher impedance than in the first state. This higher impedance may be at a single impedance level or may also vary over time, as will be explained below in more detail. In some implementations, the higher impedance in the second state at least partially decouples device control terminal 11 from transistor control terminal 15. In some implementations, overload detection circuit 19 then modifies a control signal at transistor control terminal 15 to mitigate the overload condition. For example, transistor 14 may be switched off or may be partially switched off, e.g., set to have a higher impedance, which reduces the current through the transistor. As the higher impedance in the second state of variable impedance element 18 device control terminal 11 is at least partially decoupled from transistor control terminal 15, a comparatively weak signal can be used to modify the control signal at transistor control terminal 15 and still at least partially override an external control signal applied to device control terminal 11.

In some implementations, this modifying of the control signal at transistor control terminal 15 prolongs the time transistor 14 can withstand for example a short circuit condition or other exception. Therefore, additional circuitry outside device 10 which then controls a switch-off of the system has a longer time to react to a system exception.

For example, the control signal at transistor control terminal 15 is modified by overload detection circuit 19 such that transistor control terminal 15 is set to a predefined voltage, such that transistor 14 is partially switched off, e.g., set to have a higher impedance, which reduces the current through the transistor 14. The predefined voltage to which the control signal is adjusted is, for example, selected such that the current through transistor 14 is within a predefined current range. The predefined current range may comprise a lower threshold current value and an upper threshold current value. The lower current threshold value is set based on a minimum current threshold value that is required to trigger an external protection circuit, such as overload protection circuit 221 (see FIG. 2A or 2B). In other words, the lower threshold current value is larger than or equal to a triggering threshold of an external overload protection circuit. This way it may be ensured that the overload condition can also be detected by external protection circuitry, which allows, for example, to take appropriate countermeasures on system-level. The upper current threshold value is set such that the gate driver or other external protection circuitry may switch transistor 14 fully off before transistor 14 is destroyed due to overheating or the like, caused by energy dissipated in the transistor 14 during the overload condition. For this, two factors may be considered, which are a detection time, such as a filter time, needed by the external protection circuitry to detect the overload condition, and an upper energy threshold associated with transistor 14. The upper energy threshold may be defined as the maximum amount of energy that may be dissipated in transistor 14 without destroying the transistor. In other words, the upper current threshold value is set such that the upper energy threshold of transistor 14 is not exceeded until the external protection circuitry reacts and switches transistor 14 completely off. The upper energy threshold can be determined for a given transistor of a certain transistor type and may depend on constructional details, such as geometric layout and material choice and the like (see also FIG. 4 and corresponding description), which then allows to tune the properties of overload detection circuit 19 accordingly. Dissipated energy in transistor 14 can be estimated, for example, as the integral of dissipated power over time, wherein dissipated power can be estimated as the product of current through the transistor and voltage drop across the transistor, where both current and voltage can be functions of time (see also FIG. 4 and corresponding description). For a more refined estimation, energy transfer from the transistor to its surroundings, e.g., via heat conduction or radiation, can also be taken into account.

Non-limiting details and implementation examples of the concepts discussed above with reference to FIG. 1 will be discussed further below.

Figure 2A:
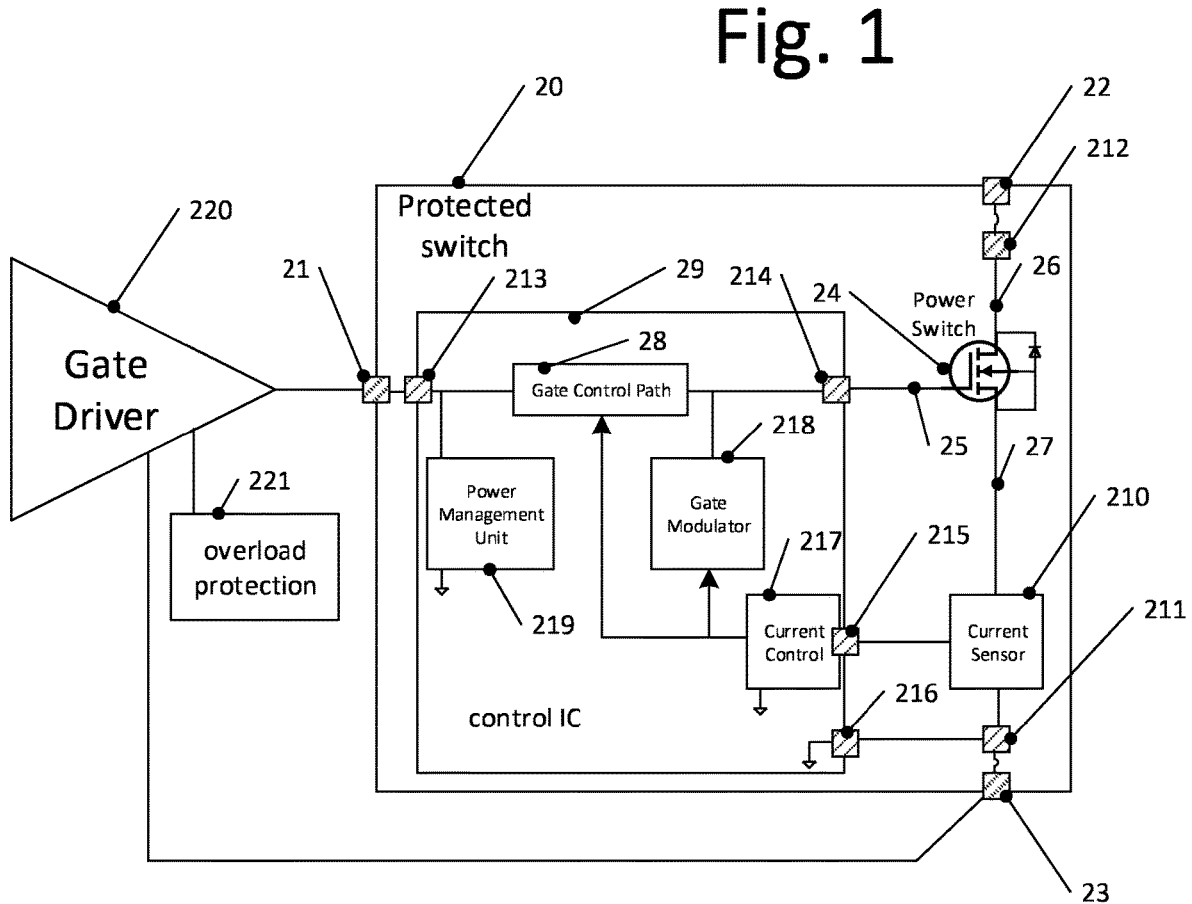
FIGS. 2A and 2B are a detailed diagrams of a transistor device according to an implementation.

FIG. 2A illustrates a system according to an implementation, including a transistor device 20 according to an implementation. Transistor device 20 includes a transistor 24, in this example a MOSFET transistor like a SiC MOSFET, as a main transistor. Transistor 24 in the case of FIG. 2A is configured to be used as a switch, to selectively electrically couple (switch on) or decouple (switch off) its source and drain terminals. Transistor 24 may be provided on a first chip die, in some implementations together with a current sensor 210. A drain terminal 26 of transistor 24 is coupled to a pad 212, which may be coupled to a drain device terminal 22 using a bond wire or the like. A source terminal 27 of transistor 24 is coupled to a pad 211 via current sensor 210. Pad 211 is coupled to device source terminal 23, again using for example a bond wire.

A gate terminal 25 of transistor 24 is coupled to a device gate terminal 21 via a control integrated circuit (IC) 29, which inter alia, as explained below in more detail, implements the function of variable impedance element 18 and overload detection circuit 19 of FIG. 1. Device source terminal 22, device drain terminal 23 and device gate terminal 21 are examples for device terminals 12, 13 and 11 respectively, of FIG. 1. With device terminals 21, 22, 23, transistor device 20 to the outside looks like a normal transistor, e.g., as if only transistor 24 were provided in the package.

Control IC 29 may be provided on a separate chip die from transistor 24, but in the same package, forming transistor device 20. It should be noted that while several components are shown as part of control IC 29 in FIG. 2A, in other implementations some or all of these components may also be provided in separate integrated circuits.

Control IC 29 includes a gate control path 28 coupled between terminals 213, 214 of control IC 29. Terminal 213 is coupled to device gate terminal 21, and terminal 214 is coupled to gate terminal 25 of transistor 24, thus coupling control IC 29 and in particular gate control path 28 thereof between device gate terminal 21 and gate terminal 25 of transistor 24.

A gate driver 220 is coupled to the device gate terminal 21 and device source terminal 23. In normal operation, gate control path 28 is set to a low impedance state, such that a control signal output by gate driver 220 can apply a gate-source voltage to transistor 24 to switch transistor 24 on or off. Therefore, from the outside of transistor device 20 the system of FIG. 2A may operate as if only gate driver 220 were directly connected to transistor 24.

Next, behavior of the system of FIG. 2A during a short circuit event will be explained.

Current sensor 210 monitors the current through transistor 24. Current sensor 210 may be any conventional current sensor, for example a shunt resistor, a magnetic field sensor based current sensor which senses the magnetic field generated by the current, a replica transistor or the like.

A measure of the current is provided to control IC 29 at a terminal 215. "Measure of the current" relates to any signal output by current sensor 210 indicative of the current or otherwise indicate the current. For example, the measure of the current may be a voltage drop across a shunt resistor. As will be explained below with reference to FIG. 2B, the measure may also be based on a fraction of the current.

A current control entity 217 compares the sensed current or other measure of the current with a threshold. In case of a short circuit, the current rises quickly, and a current above the threshold may be used as an indication of the short circuit. Therefore, current control entity 217 in such cases detects the overload condition based on a current through the transistor, using the measure of the current. In other implementations, additionally or alternatively other quantities may be monitored indicative of the short circuit, for example a slope of the current, where a fast rise over certain time may indicate a short circuit.

In case a condition indicating a short circuit or other fault is satisfied (for example current above a predefined threshold as mentioned above), current control 217 controls gate control path 28 to increase its impedance, e.g., switch to the second state mentioned above with respect to FIG. 1, such that gate driver 220 is at least partially decoupled from transistor 24. At least partially decoupled means that in some implementations, the impedance of gate control path 28 in the second state, upon detecting an over current conduction, effectively amounts to an electric isolation, thus fully decoupling gate driver 220 from transistor 24. In other implementations, the impedance of gate control path 28 is merely increased to an amount that the driving strength of gate driver 220 as seen by transistor 24 is reduced.

A gate modulator 218 then modifies the voltage at gate terminal 25 of transistor 24 to fully or partially switch off transistor 24. "Partially switch off" means that the resistance of transistor 24 is increased, without fully switching transistor 24 off. In some implementations, the changing of the gate voltage by gate modulator 218 may also be performed in stages, for example first switching transistor 24 partially off and then fully off Implementation examples of the gate control path 28 and gate modulator 218 will be explained further below referring to FIGS. 5A to 5C.

As gate driver 220, through the second state of gate control path 28, is fully or partially decoupled from gate terminal 25, gate modulator 218 need not override the full driving strength of gate driver 220, such that less driving strength is sufficient to fully or partially switch transistor 24 off. The action of gate modulator 218 causes the current through transistor 24 to decrease, thus at least prolonging the time transistor 24 can withstand the short circuit condition. In some implementations, the current may be decreased in two or more steps, for example first switching transistor 24 partially off and then, if the overload condition persists, fully off. In some implementations, the modifying of the voltage at gate terminal 25 may be regulated by current control 217 and gate modulator 218 based on the current measured by current sensor 210. In some implementations, in case the overload condition is terminated (e.g., current control entity does not detect an overcurrent any longer), regular operation may be resumed, e.g., gate control path 28 is switched back to the first state, gate modulator 218 ceases modifying the gate voltage, and gate driver 220 controls transistor 24 normally.

In some implementation, outside transistor device 20 a conventional overload protection circuit 221 may be provided, for detecting the short circuit in any conventional manner, and then switch gate driver 220 off or control gate driver 220 to switch transistor 24 off. Due to the internal mechanism of transistor device 20 explained above, e.g., the operation of control path 28 and gate modulator 218 there is more time for overload protection circuit 221 to react as would otherwise be the case.

In some implementations, as already described referring to FIG. 1 above, gate modulator 218 is configured for setting the gate voltage to a predefined voltage such that a current through transistor 24 is decreased due to increased impedance of the load path through transistor 24. For example, gate modulator 218 sets the gate voltage to a predefined value that causes the load current to be within a predefined current range. The limits of the predefined current range, e.g., the lower threshold current value and the upper threshold current value, are set as explained referring to FIG. 1 above. Thus, it may be possible to ensure a quick reaction and protection of transistor 24, while external protection circuitry, such as overload protection circuit 221, can still be triggered. It should be understood that the predefined voltage to which gate modulator 218 sets gate terminal 25 to protect the transistor 24 can be selected or set or programmed individually for each power switch or a given species of power switches having the same or similar properties.

In the implementation of FIG. 2A, control IC 29 is supplied with power provided by gate driver 220, e.g., by the control signal provided by gate driver 220. A power management unit 219 converts the control signal to appropriate voltages or currents needed for current control 217 and gate modulator 218. An implementation example of power management unit 219 will be explained further below referring to FIG. 6. In other implementations, control IC 29 may be supplied with power via separate terminals. In case of supply via gate driver 220, and an N-channel MOSFET 24 as transistor, control IC receives power only during an on-state of transistor 24, when the signal output by gate driver 220 is high. As in the other case, when the signal output by gate driver 220 is low, transistor 24 is switched off anyway, and control IC 29 is not needed during the switched off state.

Figure 2B:
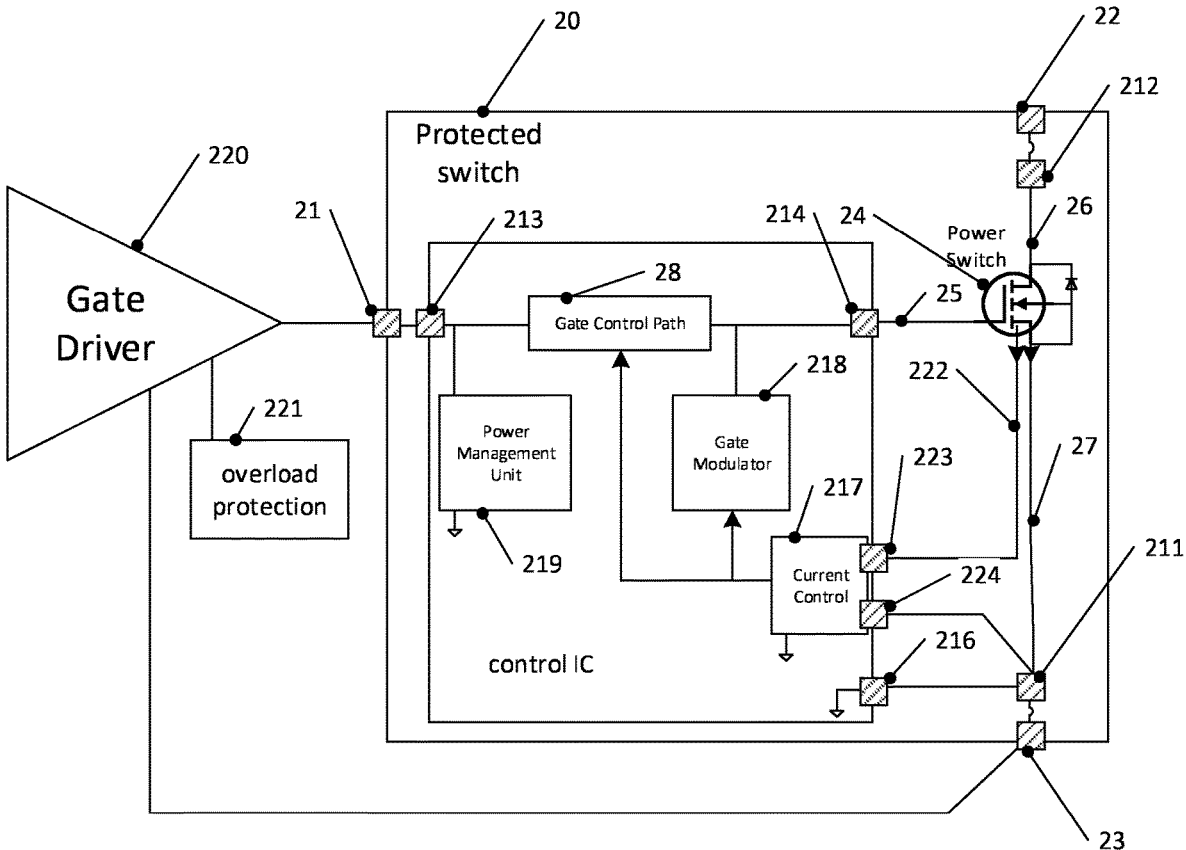

FIG. 2B is a modification of the implementation of FIG. 2A. Apart from the differences with respect to current sensing described below, the implementation of FIG. 2B corresponds to the implementation of FIG. 2A, and the above description of FIG. 2A also applies to FIG. 2B and will therefore not be repeated.

Compared to FIG. 2A, in FIG. 2B current sensor 210 is omitted. Instead, transistor 24 includes an auxiliary terminal 222, configured to provide an auxiliary current proportional to the current at source terminal 27. Such an auxiliary terminal 222 may for example be a source terminal of a current measurement transistor included in transistor 24 in addition to a main transistor and scaled with respect to the main transistor. Auxiliary terminal 222 is coupled to a measurement terminal 223 of current control entity 217, and a further terminal 224 of current control entity 217 is coupled to pad 211. In this way, the auxiliary current flows through current control entity 217, be measured in current control entity 217 for example by an internal shunt resistor and serve as the measure of the current discussed above.

Figure 3:
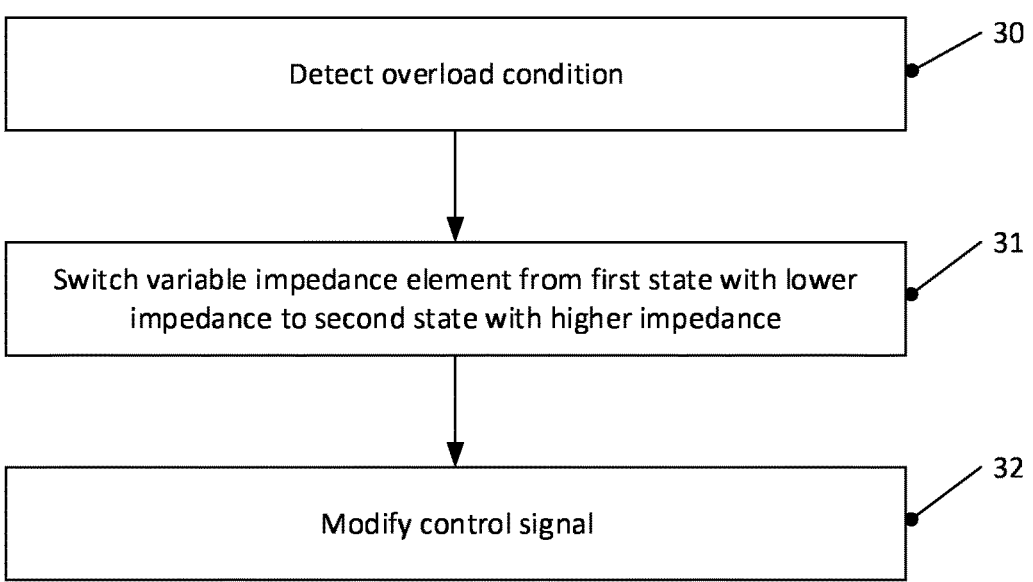
FIG. 3 is a flowchart illustrating a method according to an implementation.

FIG. 3 is a flowchart illustrating a method according to an implementation. In order to avoid repetitions, the method of FIG. 3 will be explained referring to the previous explanations for FIGS. 1 and 2, and the method of FIG. 3 may be implemented using the transistor devices as discussed with reference to FIGS. 1 and 2. However, the method of FIG. 3 may also be implemented in other transistor devices.

At 30, the method of FIG. 3 comprises detecting an overload condition, for example by overload detection circuit 19 of FIG. 1 or using current sensor 210 and current control 217 of FIG. 2A or 2B.

At 31 the method comprises switching a variable impedance element between a driver and a control terminal of a transistor, for example variable impedance element 18 or gate control path 28, from a first state with lower impedance to a second state with higher impedance, to at least partially decouple the driver from the control terminal, as mentioned above. Optionally, at 32 the method may then comprise modifying a control signal at the control terminal of the transistor to at least partially turn the transistor off, e.g., to increase the resistance of the transistor and therefore reduce a current through the transistor, as explained above for gate modulator 218.

Example effects of the above implementations will now be explained referring to FIG. 4.

In short circuit conditions the transistor of the transistor device is usually stressed with the nominal DC voltage (e.g., supply voltage provided to one of the load terminals, while a load is coupled to the other load terminal of the transistor device) of the system at a very low impedance load (e.g., the short circuit equivalent). In such conditions the current is no longer defined by the load but rather limited only by the maximum current capability of the transistor, with values that could easily reach or exceed ten times the rated current. The higher the conductivity (the lower the on-resistance) of the switch, the higher the short circuit current.

The energy dissipated during a short condition $E_{short}$ in the power switch cumulates over time and can be computed with the integral of the product of the applied voltage times the total current. In a power switch, and particularly in a SiC MOSFET, the short circuit energy $E_{short}$ is then linked to drain-to-source voltage $v_{Ds}(t)$ and drain current $i_D(t)$ (both being time dependent entities) by the following expression $$E_{short}(T) = \int_0^T v_{DS}(t) * i_D(t)\, dt \qquad (1)$$

$v_{DS}(t)$ being almost constant to its maximum value $V_{DC}$ (equivalent to the DC voltage of the system) and $i_D(t)$ the full current the switch can carry in short circuit condition; both these entities are quite large in nature therefore the dissipated energy is soon reaching extreme values: because $E_{short}$ increases with time (the longer time t the higher the energy) it will eventually reach a critical value $E_{crit}$ that represents the maximum energy the given power switch can manage.

In general, the maximum energy depends on the type of materials (e.g., the semiconductor material and the metallic interconnects) and the quantity of material (e.g., volume). Certain material combinations may withstand higher energy levels than others but certainly the smaller the volume (or the power switch die area) the smaller the total amount of energy it can take.

For a given semiconductor technology, for example SiC Mosfet, it is convenient to formulate the above in terms of density figures, e.g., drain current density $$j_D = \frac{j_D(t)}{A}$$

and energy density $$e = \frac{E}{A}$$

where A indicates the area of the device. Correspondingly we could define a critical energy density, $e_{crit}$, which depends on the specific technology materials.

Subsequent generations of power switch technologies in a given semiconductor material of choice are usually configured to get more performance from the same die size or, equivalently, to get higher current density so that a given load current could be managed with a smaller die size.

In an extreme simplification, the n-th generation, $Gen_N$ of a technology would compare to its predecessor $Gen_{N-1}$ by an improvement factor that, for what concerns the current, is computed by the ratio $$K_G = \frac{j_{D,GenN}}{j_{D,GenN-1}}$$

with, of course, $K_G > 1$. Applying the same rational to equation (1) above and assuming the same device area A is used for both generations one could see that $Gen_N$ would dissipate more energy than $Gen_{N-1}$ by a factor $K_G$.

$$E_{short,GenN}(T) = A \int_0^T v_{DS}(t) * j_{D,GenN}(t)\, dt = \quad (2)$$

$$K_G A \int_0^T v_{DS}(t) * j_{D,GenN-1}(t)\, dt = K_G E_{short,GenN-1}(T)$$

Given the fact that the basic technology materials are, in first approximation, roughly the same across the generations, it appears clear $Gen_N$ will reach the critical energy sooner than $Gen_{N-1}$. Therefore, generation N will naturally have a smaller short circuit capability than generation N−1.

Figure 4:
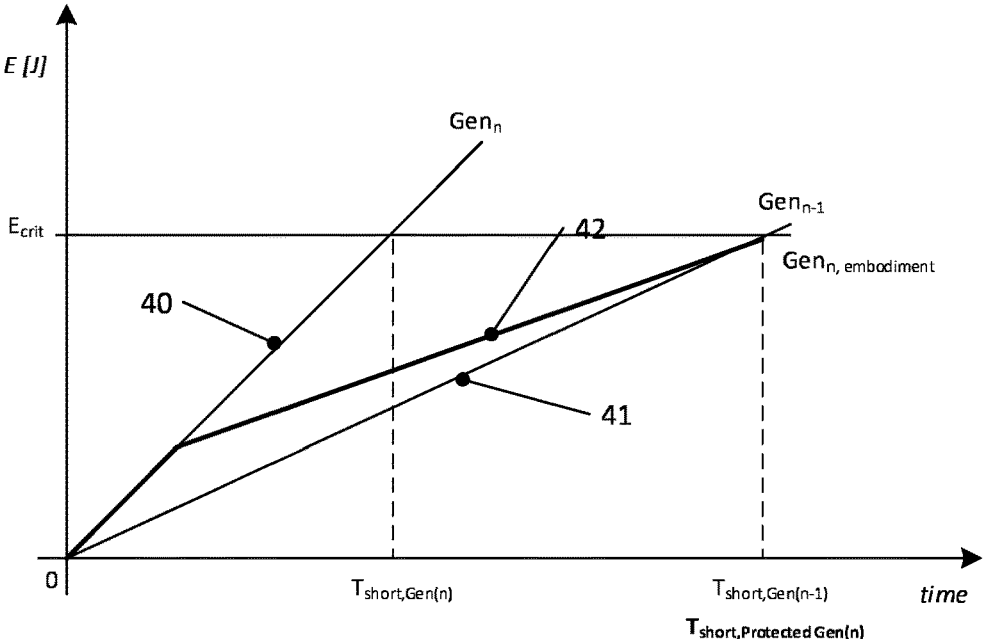
FIG. 4 is a graph used for explaining the effects of some implementations.

This is illustrated in FIG. 4, where a curve 41 illustrates the accumulated energy E in Joule (J) over time for generation $Gen_{N-1}$, and a curve 40 illustrates the same for the next generation $Gen_N$ without additional measures. As can be seen, without further measure the maximum time $T_{short, Gen}$ until a critical energy $E_{crit}$ is reached is shorter for generation n than for generation n−1. With the techniques described above, using the variable impedance element and gate modulator, in some implementations, as illustrated by a curve 42, also for generation N the time until the critical energy is reached may be made comparable to the one of generation N−1, as indicated by a time $T_{short,implementation\ Gen(n)}$. It should be noted that in the beginning curve 42 coincides with curve 40, until the mechanism described above detects the overcurrent and reacts as described above. It should be noted that the curves in FIG. 4 are only schematic examples, and the actual points may differ, also depending on implementation of the variable impedance element and the modification of the control signal for example by gate modulator 218.

Next, various implementations of a variable impedance element like variable impedance element 18 of FIG. 1 or gate control path 28 of FIG. 2A or 2B, and of a gate modulator like gate modulator 218 of FIG. 2A or 2B will be described referring to FIGS. 5A to 5C. The description will be made in the context of the implementations of FIGS. 2A and 2B. However, the implementation examples of FIGS. 5A to 5C may also be used in other transistor devices, for example transistor device 10 of FIG. 1 or with other transistors than transistor 24, by adapting voltage levels accordingly. Reference numerals in FIGS. 5A to 5C corresponding to reference numerals already used in FIGS. 2A and 2B refer to the same elements and will not be described again.

Figures 5A, 5B, 5C, 6:
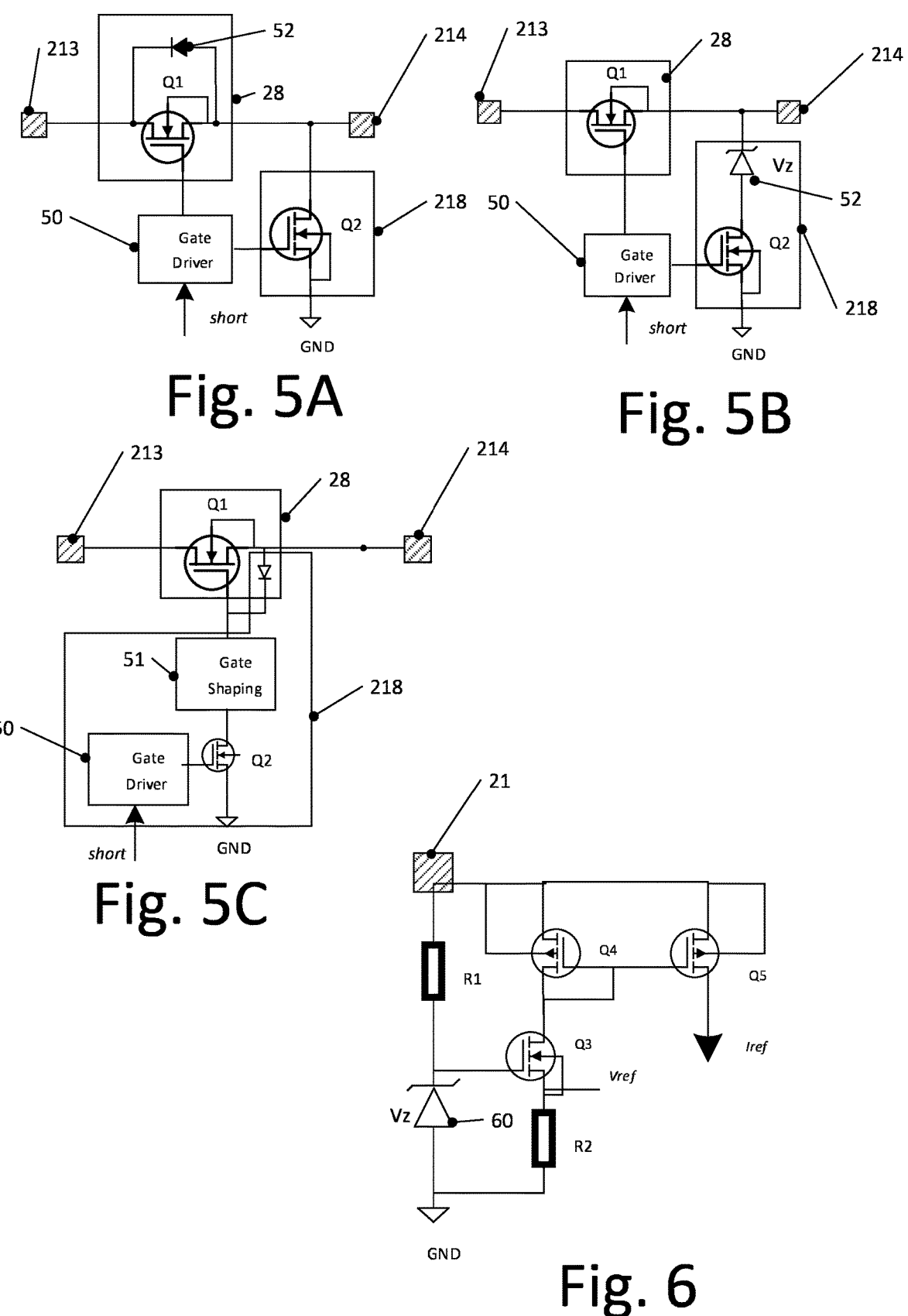
FIGS. 5A-5C are circuit diagrams for illustrating various implementation possibilities of variable impedance elements and gate modulators according to some implementations.
FIG. 6 is a circuit diagram illustrating an implementation possibility of a power management unit useable in some implementations.

In FIGS. 5A and 5B, gate control path 28 is implemented as a depletion transistor Q1, which is normally on, e.g., provides a low impedance electrically conducting path between terminals 213 and 214 when no control signal is applied to its gate.

When a short circuit is detected by overload detection circuit 19 of FIG. 1 or current control entity 217 of FIG. 2A or FIG. 2B, a control signal short indicating the short circuit condition is provided to a gate driver 50. Gate driver 50, both in FIG. 5A and FIG. 5B, controls depletion transistor Q1 to be at least partially switched off, thus decoupling terminal 213 from terminal 214 and (see FIGS. 2A and 2B) therefore decoupling gate driver 220 from gate terminal 25 of transistor 24.

In FIG. 5A, gate modulator 218 is formed by a transistor Q2. Transistor Q2 may be a normally off transistor. Upon receiving the indication of the short circuit, gate driver 50 controls transistor Q2 to be switched on, coupling terminal 214 and therefore gate terminal 25 of transistor 24 to ground, thus switching transistor 24 off.

In FIG. 5A, a body diode 52 of transistor Q1 is explicitly shown, but may also be present in the implementations of FIGS. 5B and 5C. Due to this body diode 52, gate driver 220 may switch off transistor 24 also when gate control path 28 is set to a second state which is essentially electrically isolating. If gate driver 220 in such a case wants to turn off transistor 24, it pulls terminal 213 to 0V. If, in such a situation, terminal 214 is kept at some higher voltage by gate modulator 218, e.g., 8V, body diode 52 is forward biased. This enables the gate driver to sink current from gate terminal 25 of transistor 24 via body diode 52.

FIG. 5B is a modification of FIG. 5A. Here, gate modulator 218 additionally includes a Zener diode 52 causing a voltage drop Vz. In this case, when gate driver 50 switches transistor Q2 on, the voltage at terminal 214 and thus on gate terminal 25 of transistor 24 is drawn to Vz, which may switch transistor 24 partially off.

In the implementation of FIG. 5C, gate driver 50 directly controls only transistor Q2. This, via a gate shaping unit 51, controls transistor Q1. Gate shaping unit 51 outputs a predefined control signal to the gate of transistor Q1, thus shaping the signal at terminal 214 in a desired manner to control transistor 24.

FIG. 6 shows an example implementation of power management unit 219 of FIGS. 2A and 2B, e.g., FIG. 6 illustrates how a reference voltage and reference current may be generated based on a voltage from gate driver 220 at device gate terminal 21. Again, while FIG. 6 is explained in the context of FIGS. 2A and 2B, it may also be used in other transistor devices for voltage supply.

In FIG. 6, a Zener diode 60 coupled in series with a resistor R1 between terminal 21 and ground as shown is used to generate a reference voltage Vref, also using transistor Q3 and resistor R2. Based on this reference voltage, using transistors Q4 and Q5 coupled as shown a reference current Iref is generated. Reference voltage Vref and/or reference current Iref may be used to power the various elements of control IC 29. Furthermore, Iref, Vref or values derived therefrom, for example derived by a voltage or current divider, may be used as threshold voltage or current in current control 217, to detect an overload condition. It should be noted that FIG. 6 illustrates only one possible implementation of power management unit 219, and reference voltages or currents may also be derived from the control signal output by gate driver 220 in a different manner.

Figure 7:
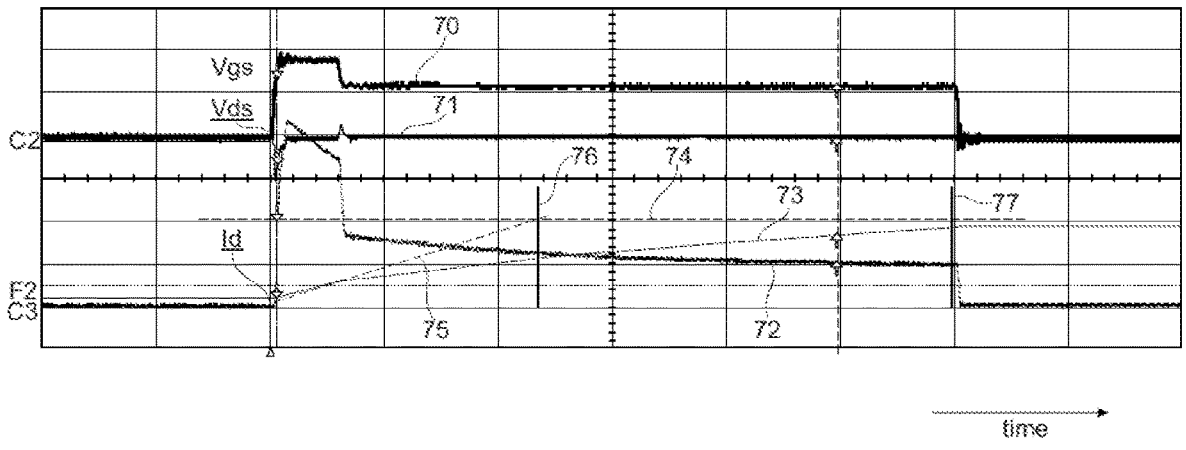
FIG. 7 is a diagram illustrating measurements showing the effect of some implementations.

FIG. 7 shows some example signals in a specific implementation and for further illustration. The signals of FIG. 7 are based on an implementation similar to FIG. 5B, where the gate source voltage VGS shown by a curve 70 is reduced to a predefined level in response to detecting an over current condition.

In the scenario of FIG. 7, the switch is switched on by gate driver 220 setting the gate source voltage to a normal on-voltage, as illustrated by curve 70, causing a drop in the drain source voltage represented by a curve 71 and a rise of the drain current as represented by curve 72. In response to detecting a short circuit condition, then as shown by curve 70, the gate source voltage is reduced, such that the drain current is also reduced. A curve 73 illustrates the dissipated energy in the transistor, which reaches a critical energy represented by a dashed line 74 only around a time indicated by a line 77, at which for example external overload detection 221 reacts and turns the device off. Without the modification of the gate voltage, the energy would for example approximately rise as indicated by a dashed curve 75, reaching the critical energy at a time indicated by a line 76, significantly before external circuitry reacts, which in turn could lead to damaging of the transistor device. Therefore, in some implementations, by providing the modification of the gate voltage as described the transistor device may be protected.

Aspects

Some implementations are defined by the following aspects:

Aspect 1. A transistor device, comprising:
a first device load terminal,
a second device load terminal,
a device control terminal, a transistor having a first transistor load terminal coupled to the first device load terminal, a second transistor load terminal coupled to the second device load terminal, and a transistor control terminal coupled to the device control terminal,
a variable impedance element coupled between the device control terminal and the transistor control terminal, and
an overload detection circuit configured to switch the variable impedance element from a first state with lower impedance to a second state with higher impedance in response to detecting an overload condition.

Aspect 2. The transistor device of aspect 1, wherein the overload condition is an overcurrent condition, and wherein the overload detection circuit is configured to detect the overload condition based on a current through the transistor.

Aspect 3. The transistor device of aspect 1 or 2, wherein at least the overload detection circuit is configured to be supplied by a signal at the device control terminal.

Aspect 4. The transistor device of any one of aspects 1 to 3, wherein the second state with higher impedance decouples the device control terminal from the transistor control terminal.

Aspect 5. The transistor device of any one of aspects 1 to 4, wherein the variable impedance element comprises a normally on transistor.

Aspect 6. The transistor device of any one of aspects 1 to 5, wherein the overload detection circuit is further configured to modify a signal at the transistor control terminal to mitigate the overload condition in response to detecting an overload condition.

Aspect 7. The transistor device of aspect 6, wherein modifying the signal at the transistor control terminal comprises setting the transistor control terminal to a predefined voltage.

Aspect 8. The transistor device of any one of aspects 6 to 7, wherein modifying the signal at the transistor control terminal comprises switching off the transistor.

Aspect 9. The transistor device of any one of aspects 6 to 8, wherein modifying the signal at the transistor control terminal comprises modifying the signal to different signal levels over time.

Aspect 10. The transistor device of any one of aspects 6 to 9, wherein modifying the signal at the transistor control terminal comprises modifying the signal according to a predefined signal waveform.

Aspect 11. The transistor device of any one of aspects 6 to 10, wherein the overload detection circuit is further configured to set the variable impedance element to the first state and to stop the modifying in response to detecting that the overload condition has ended.

Aspect 12. The transistor device of any one of aspects 1 to 11, wherein the transistor device is provided in a single package, wherein the first device load terminal, the second device load terminal, and the device control terminal are external terminals of the package.

Aspect 13. The transistor device of any one of aspects 1 to 12, wherein the transistor is provided on a first chip die, and the overload detection circuit is provided on at least one second chip die different from the first chip die.

Aspect 14. A system, comprising:
the transistor device of any one of aspects 1 to 13,
a driver coupled to the device control terminal, and
an overload protection circuit outside the transistor device and configured to detect the overload condition and to switch the transistor device off in response to detecting the overload condition.

Aspect 15. The system of aspect 14, wherein a time duration the overload protection circuit requires to detect the overload condition and to switch the transistor device off in response to detecting the overload condition is longer than a time duration the overload detection circuit requires to switch the variable impedance element from the first state with lower impedance to the second state with higher impedance in response to detecting the overload condition.

Aspect 16. A method for operating a transistor device, comprising:

detecting an overload condition, and switching a variable impedance element between a driver and a control terminal of a transistor from a first state with lower impedance to a second state with higher impedance in response to detecting the overload condition.

Aspect 17. The method of aspect 16, wherein the overload condition is an overcurrent condition, and wherein detecting the overload condition comprises detecting the overload condition based a current through the transistor.

Aspect 18. The method of aspect 16 to 17, wherein switching the variable impedance element to the second state with higher impedance decouples the driver from the control terminal of the transistor.

Aspect 19. The method of any one of aspects 17 to 18, further comprising modifying a signal at the control terminal of the transistor to mitigate the overload condition in response to detecting an overload condition.

Aspect 20. The method of aspect 19, wherein modifying the signal at the control terminal of the transistor comprises setting the control terminal of the transistor to a predefined voltage.

Aspect 21. The method of any one of aspects 19 to 20, wherein modifying the signal at the control terminal of the transistor comprises switching off the transistor.

Aspect 22. The method of any one of aspects 19 to 21, wherein modifying the signal at the control terminal of the transistor comprises modifying the signal to different signal levels over time.

Aspect 23. The method of any one of aspects 19 to 22, wherein modifying the signal at the control terminal of the transistor comprises modifying the signal according to a predefined signal waveform.

Aspect 24. The method of any one of aspects 19 to 23, further comprising setting the variable impedance element to the first state and to stop the modifying in response to detecting that the overload condition has ended.

Aspect 25. The system of aspect 14 or 15, wherein the overload condition is an overcurrent condition, wherein both the overload detection circuit and the overload protection circuit are configured to detect the overload condition based on a current through the transistor, wherein the overload protection circuit has a predefined current threshold and predefined detection time, wherein the overload protection circuit is configured to detect the overload condition based on the current through the transistor being equal to or exceeding the predefined current threshold for the predefined detection time, and wherein the predefined voltage is selected such that the current through the transistor is at least equal to the predefined current threshold of the overload protection circuit.

Although specific implementations have been illustrated and described herein, it will be appreciated by those of ordinary skill in the art that a variety of alternate and/or equivalent implementations may be substituted for the specific implementations shown and described without departing from the scope of the present implementation. This application is intended to cover any adaptations or variations of the specific implementations discussed herein. Therefore, it is intended that this implementation be limited only by the claims and the equivalents thereof.

The invention claimed is:

1. A transistor device, comprising:

a first device load terminal;

a second device load terminal;

a device control terminal;

a transistor having a first transistor load terminal coupled to the first device load terminal, a second transistor load terminal coupled to the second device load terminal, and a transistor control terminal coupled to the device control terminal;

a variable impedance element coupled between the device control terminal and the transistor control terminal;

an overload detection circuit configured to switch the variable impedance element from a first state with lower impedance to a second state with higher impedance in response to detecting an overload condition; and a power management unit configured to generate a reference voltage and a reference current to supply the overload detection circuit based on a voltage at the device control terminal, wherein the overload detection circuit is further configured to modify a signal at the transistor control terminal to mitigate the overload condition in response to detecting the overload condition, wherein the overload detection circuit is configured to modify the signal at the transistor control terminal by modifying the signal at the transistor control terminal to different signal levels over time, wherein the power management unit includes a first resistor, a Zener diode, a first further transistor, and a second resistor, wherein the first resistor and the Zener diode are coupled, at a first node, in series with the device control terminal and ground, wherein the first further transistor and the second resistor are coupled, at a second node, in series with the device control terminal and ground, wherein the first node is coupled to a transistor control terminal of the first further transistor, wherein the second node is configured to provide the reference voltage, wherein the power management unit includes a second further transistor and a third further transistor having respective transistor control terminals coupled together, wherein the second further transistor, arranged between the device control terminal and the first further transistor, is coupled in series with the first further transistor, and wherein the third further transistor is coupled to the device control terminal and is configured to provide the reference current.

2. The transistor device of claim 1, wherein the overload condition is an overcurrent condition, and wherein the overload detection circuit is configured to detect the overload condition based on a current conducted through the transistor.

3. The transistor device of claim 1, wherein the second state with higher impedance is configured to decouple the device control terminal from the transistor control terminal.

4. The transistor device of claim 1, wherein the variable impedance element comprises a normally-on transistor.

5. The transistor device of claim 1, wherein modifying the signal at the transistor control terminal further comprises switching off the transistor.

6. The transistor device of claim 1, wherein the overload detection circuit is further configured to set the variable impedance element to the first state and to stop modifying the signal at the transistor control terminal in response to detecting that the overload condition has ended.

7. The transistor device of claim 1, wherein modifying the signal at the transistor control terminal comprises modifying the signal at the transistor control terminal according to a predefined signal waveform.

8. The transistor device of claim 1, wherein the transistor device is provided in a single package, and wherein the first device load terminal, the second device load terminal, and the device control terminal are external terminals of the single package.

9. The transistor device of claim 1, wherein the transistor is provided on a first chip die, and the overload detection circuit is provided on at least one second chip die different from the first chip die.

10. The transistor device of claim 1, wherein the power management unit is configured to convert the voltage at the device control terminal into the reference voltage or the reference current.

11. The transistor device of claim 1, wherein the voltage at the device control terminal is a control signal for controlling the transistor.

12. The transistor device of claim 1, wherein the overload detection circuit is configured to use the reference voltage or the reference current, or a voltage or a current derived from the reference voltage or the reference current, respectively, as a threshold for detecting the overload condition.

13. A system, comprising:
a transistor device, comprising:
a first device load terminal;
a second device load terminal;
a device control terminal;
a transistor having a first transistor load terminal coupled to the first device load terminal, a second transistor load terminal coupled to the second device load terminal, and a transistor control terminal coupled to the device control terminal;
a variable impedance element coupled between the device control terminal and the transistor control terminal;
an overload detection circuit configured to switch the variable impedance element from a first state with lower impedance to a second state with higher impedance in response to detecting an overload condition,
wherein the overload detection circuit is further configured to modify a signal at the transistor control terminal to mitigate the overload condition in response to detecting the overload condition, and wherein modifying the signal at the transistor control terminal comprises setting the transistor control terminal to a predefined voltage;
a power management unit configured to generate a reference voltage and a reference current to supply the overload detection circuit based on a voltage at the device control terminal;

a driver coupled to the device control terminal and configured to provide the voltage to the device control terminal; and
an overload protection circuit outside the transistor device and configured to detect the overload condition and to switch the transistor device off in response to detecting the overload condition,
wherein the power management unit includes a first resistor, a Zener diode, a first further transistor, and a second resistor,
wherein the first resistor and the Zener diode are coupled, at a first node, in series with the device control terminal and ground,
wherein the first further transistor and the second resistor are coupled, at a second node, in series with the device control terminal and ground,
wherein the first node is coupled to a transistor control terminal of the first further transistor,
wherein the second node is configured to provide the reference voltage,
wherein the power management unit includes a second further transistor and a third further transistor having respective transistor control terminals coupled together,
wherein the second further transistor, arranged between the device control terminal and the first further transistor, is coupled in series with the first further transistor, and
wherein the third further transistor is coupled to the device control terminal and is configured to provide the reference current.

14. The system of claim 13, wherein a first time duration the overload protection circuit requires to detect the overload condition and to switch the transistor device off in response to detecting the overload condition is longer than a second time duration the overload detection circuit requires to switch the variable impedance element from the first state with lower impedance to the second state with higher impedance in response to detecting the overload condition.

15. The system of claim 13, wherein the overload condition is an overcurrent condition,
wherein both the overload detection circuit and the overload protection circuit are configured to detect the overload condition based on a current conducted through the transistor,
wherein the overload protection circuit has a predefined current threshold and predefined detection time,
wherein the overload protection circuit is configured to detect the overload condition based on the current conducted through the transistor being equal to or exceeding the predefined current threshold for the predefined detection time, and
wherein the predefined voltage is selected such that the current, conducted through the transistor during the overload condition, is at least equal to the predefined current threshold of the overload protection circuit.

16. The system of claim 13, wherein the overload detection circuit is configured to modify the signal at the transistor control terminal by modifying the signal at the transistor control terminal to different signal levels over time in steps, including a first step to switch the transistor partially off, and, based on the overload condition persisting while the transistor is partially off, a second step to switch the transistor fully off, such that the transistor control terminal is set to different predefined voltages during the overload condition.

17. The system of claim 16, wherein a first time duration the overload protection circuit requires to detect the overload condition and to switch the transistor device off in response to detecting the overload condition is longer than a second time duration the overload detection circuit requires to switch the variable impedance element from the first state with lower impedance to the second state with higher impedance in response to detecting the overload condition.

18. The system of claim 17, wherein the overload condition is an overcurrent condition, wherein both the overload detection circuit and the overload protection circuit are configured to detect the overload condition based on a current conducted through the transistor, wherein the overload protection circuit has a predefined current threshold and predefined detection time, wherein the overload protection circuit is configured to detect the overload condition based on the current conducted through the transistor being equal to or exceeding the predefined current threshold for the predefined detection time, and wherein the predefined voltage is selected such that the current, conducted through the transistor during the overload condition, is at least equal to the predefined current threshold of the overload protection circuit.

19. The system of claim 16, wherein the overload condition is an overcurrent condition, wherein both the overload detection circuit and the overload protection circuit are configured to detect the overload condition based on a current conducted through the transistor, wherein the overload protection circuit has a predefined current threshold and predefined detection time, wherein the overload protection circuit is configured to detect the overload condition based on the current conducted through the transistor being equal to or exceeding the predefined current threshold for the predefined detection time, and wherein the predefined voltage is selected such that the current, conducted through the transistor during the overload condition, is at least equal to the predefined current threshold of the overload protection circuit.

20. A method for operating a transistor device, comprising:

detecting, by an overload detection circuit, an overload condition;

switching, by the overload detection circuit, a variable impedance element coupled between a driver and a control terminal of a transistor from a first state with lower impedance to a second state with higher impedance in response to detecting the overload condition;

modifying, by the overload detection circuit, a signal at the control terminal to mitigate the overload condition in response to detecting the overload condition, wherein modifying the signal at the control terminal includes modifying the signal at the control terminal to different signal levels over time;

receiving a voltage at a device control terminal, the signal being derived from the voltage;

converting, by a power management unit, the voltage at the device control terminal into a reference voltage and a reference current; and utilizing, by the overload detection circuit, the reference voltage and the reference current for detecting the overload condition, wherein the power management unit includes a first resistor, a Zener diode, a first further transistor, and a second resistor, wherein the first resistor and the Zener diode are coupled, at a first node, in series with the device control terminal and ground, wherein the first further transistor and the second resistor are coupled, at a second node, in series with the device control terminal and ground, wherein the first node is coupled to a transistor control terminal of the first further transistor, wherein the second node is configured to provide the reference voltage, wherein the power management unit includes a second further transistor and a third further transistor having respective transistor control terminals coupled together, wherein the second further transistor, arranged between the device control terminal and the first further transistor, is coupled in series with the first further transistor, and wherein the third further transistor is coupled to the device control terminal and is configured to provide the reference current.

* * * * *